United States Patent [19]
Teoh et al.

[11] Patent Number: 6,110,322
[45] Date of Patent: Aug. 29, 2000

[54] PREVENTION OF GROUND FAULT INTERRUPTS IN A SEMICONDUCTOR PROCESSING SYSTEM

[75] Inventors: Hong Bee Teoh, Saratoga; James Jin-Long Chen, San Jose; Cuong C. Nguyen, San Jose; Hanh D. Nguyen, San Jose, all of Calif.

[73] Assignee: Applied Materials, Inc., Santa Clara, Calif.

[21] Appl. No.: 09/036,536

[22] Filed: Mar. 6, 1998

[51] Int. Cl.$^7$ ..................................................... C23F 1/02
[52] U.S. Cl. ................. 156/345; 118/725; 118/723 E; 438/715; 216/71
[58] Field of Search ...................... 156/345; 438/715; 118/725, 723 E; 219/482, 268, 385, 457; 216/71

[56] References Cited

U.S. PATENT DOCUMENTS

| | | |
|---|---|---|
| 3,975,663 | 8/1976 | Moorey . |
| 4,006,409 | 2/1977 | Adams . |
| 4,080,640 | 3/1978 | Elms et al. . |
| 4,102,298 | 7/1978 | Dietze et al. ........................... 219/499 |
| 4,484,234 | 11/1984 | Kimura . |
| 4,870,527 | 9/1989 | Zaleski . |
| 5,630,881 | 5/1997 | Ogure et al. ............................ 118/725 |
| 5,660,740 | 8/1997 | Komino .................................. 216/67 |

FOREIGN PATENT DOCUMENTS

| | | | |
|---|---|---|---|
| 0 678 903 A1 | 10/1995 | European Pat. Off. | ........ H01L 21/00 |
| 0 855 735 A2 | 7/1998 | European Pat. Off. | ......... H01J 37/32 |
| 60-116123 | 6/1985 | Japan | ........................... H01L 21/205 |
| 8-191049 | 7/1996 | Japan | ........................... H01L 21/205 |
| 9-267233 | 10/1997 | Japan | ........................... H01L 21/205 |

*Primary Examiner*—Thi Dang
*Attorney, Agent, or Firm*—Townsend and Townsend and Crew

[57] ABSTRACT

A pedestal heating system provided for heating a pedestal disposed in the processing chamber of a substrate processing system. A pedestal heating system according to the present invention includes: a heater power supply, a transformer, coupled to the heater power supply, a heater element coupled to the transformer, and an RF ground electrode. The transformer is configured to reduce leakage current from the heater element to various elements of the substrate processing system by localizing current leakage loops. The heater element and RF ground electrode are disposed within the pedestal. Preferably, the transformer is simply an isolation transformer. Where an RF energy source is used, such as in a plasma CVD processing system, an EMI filter may be coupled between the transformer and the heater element, or at another point in the power supply chain to prevent feed-through of RF energy to other of the substrate processing system's subsystems, or other sensitive electronic circuitry coupled to the facility's power supply.

20 Claims, 6 Drawing Sheets

PREVENTION OF GROUND FAULT INTERRUPTS IN A SEMICONDUCTOR PROCESSING SYSTEM

BACKGROUND OF THE INVENTION

The present invention relates to substrate processing systems. More specifically, the present invention relates to the avoidance of unnecessary tripping of ground fault interruption (GFI) circuitry used in such substrate processing systems.

Ground fault interrupt circuitry is an important subsystem in today's substrate processing systems. GFI circuitry detects differences in the current flowing into and out of certain subsystems of a substrate processing system, and disconnects power from the system if the difference between the two exceeds a given threshold. This occurs when current leaks from normal circuits in the system and flows via alternate circuits to ground. This is a more specialized case of the general ground fault, where any non-equipment circuit to ground is to be avoided. Ground faults should be avoided for a variety of reasons, among them noise in electronic circuits (e.g., processing system control circuitry) and operator safety (avoiding the situation where an operator offers the path of least resistance to ground).

As device sizes have become smaller and integration density has increased, issues that were not previously considered important by the industry have become of concern. As a result, several factors have often required the alteration of process parameters to account for the type of film being deposited and the uses to which that film will be put. Thus, for a given application, such parameters will be varied to provide a film having optimal characteristics for the chosen application. For example, the temperature at which a film is deposited can affect the quality of the film deposited. In certain applications, relatively higher temperatures are preferable because the reactions used to deposit the film cannot take place at lower temperatures. Ceramic pedestals are preferable to pedestals constructed of materials such as metal because ceramic pedestals are less susceptible to reaction with the reactants used in these processes and to failure (e.g., melting) at relatively high temperatures employed.

Unfortunately, certain of these processes have encountered unscheduled shutdowns by the substrate processing system's GFI circuitry. The detection and appropriate handling of ground faults is important for several reasons, including operator safety. If a ground fault exists in a piece of electrical equipment, an operator coming in contact with the equipment may offer a relatively low-resistance path to ground and so be subjected to the risk of electrical shock (although the risk varies with the amount of leakage current). In fact, various safety standards have been promulgated that govern the acceptable levels of leakage current in such systems (e.g., <3.5 mA for operator safety (U.S. National Electrical Code Section 250-21) and <30 mA for equipment protection (Semiconductor Equipment and Materials International (SEMI) Facilities Standards and Safety Guideline SEMI S9-95)).

However, interruptions due to ground faults should be minimized. The intermittent and unscheduled interruption of substrate processing is undesirable for a number of reasons. First, an unscheduled shutdown seriously degrades system throughput because the substrates currently being processed are most likely ruined by such an event, other substrates (in a multi-chamber system) may also be ruined, and one or more processing chambers will likely require reactants to be flushed out. The chamber(s) will also likely require one or more cleaning steps. Additionally, the offending machine's processing line is likewise interrupted, requiring re-initialization of the other machines in the line. All these extra steps and the time they require are even more problematic to an end-user of such systems because the interruptions are unscheduled and intermittent. Accordingly, a solution to the problem of spurious ground faults in such systems is needed.

SUMMARY OF THE INVENTION

The present invention provides a method and apparatus for use in the processing of substrates. More specifically, the present invention relates to the avoidance of unscheduled and intermittent failures in substrate processing equipment as a result of ground faults.

The inventors discovered that the offending ground faults are caused by current leakage from the heater element used to heat the pedestal upon which the substrate rests, as well as from (and between) the heater element's supply lines. The inventors also discovered that in substrate processing systems employing a plasma, some of the RF energy used to create the plasma feeds through to the heater element driver and the facility's power supply. This, in turn, causes the processing system's electronic circuitry (and that of other systems coupled to the facility's power supply) to experience electromagnetic interference (EMI), interfering with the operation of, or even damaging such circuitry. The inventors discovered that the leakage currents observed are caused by a drastic reduction in the volume resistance of the pedestal which occurs when the pedestal's temperature rises above about 500° C. due to the characteristics of the material from which the pedestal is formed.

The present invention avoids unscheduled and intermittent failures in substrate processing equipment as a result of the generation of spurious ground faults by preventing the unnecessary tripping of GFI circuitry. The present invention does so by preventing leakage from the heating element to various surrounding elements that are at other potentials (e.g., at ground). The present invention also prevents feed-through of RF energy when an RF plasma is employed.

According to one aspect of the invention, a pedestal heating system is provided for heating a pedestal disposed in the processing chamber of a substrate processing system. A pedestal heating system according to the present invention includes a heater power supply, a transformer coupled to the heater power supply, a heater element coupled to the transformer, and an RF ground electrode. The transformer, preferably an isolation transformer, is configured to avoid leakage current between the heater element and its supply lines, and other substrate processing system components by localizing any current leakage loops to the heater element. The heater element and RF ground electrode are disposed within the pedestal. The use of a transformer also reduces leakage current from the heater element to a chamber wall of the processing chamber. Where an RF energy source is used, such as in a plasma CVD processing system, an EMI filter may be coupled between the transformer and the heater element, or at another point in the power supply chain to prevent feed-through of RF energy to other of the substrate processing system's subsystems, or other sensitive electronic circuitry coupled to the facility's power supply.

These and other embodiments of the present invention, as well as its advantages and features are described in more detail in conjunction with the text below and attached figures.

DETAILED DESCRIPTION OF THE INVENTION

I. Introduction

The inventors discovered that current leakage from the heater element (as well as from the heater element's supply lines) caused the offending ground faults. The inventors also discovered that in substrate processing systems employing a plasma, some of the RF energy used to create the plasma can feed through to the heater element driver and the facility's power supply. In turn, the inventors discovered that these leakage currents are caused by a drastic reduction in the volume resistance of the pedestal that occurs when the pedestal's temperature rises above about 500° C. In addition to the intentional heating of the pedestal by the heating element as part of substrate processing, this increase in temperature can be traced to heating caused by the plasma used in some processes.

Once this causal chain had been identified, the inventors found that spurious ground faults in a substrate processing system employing such relatively high processing temperatures could be avoided by isolating the heater element from the processing system's power supply. The inventors also found that the RF energy used for plasma generation, which might otherwise feed through to the facility's main power supply, could be reduced or eliminated using an EMI filter. Pedestals which may benefit from the present invention include those of conventional design.

II. Exemplary CVD System

Figure 1A:
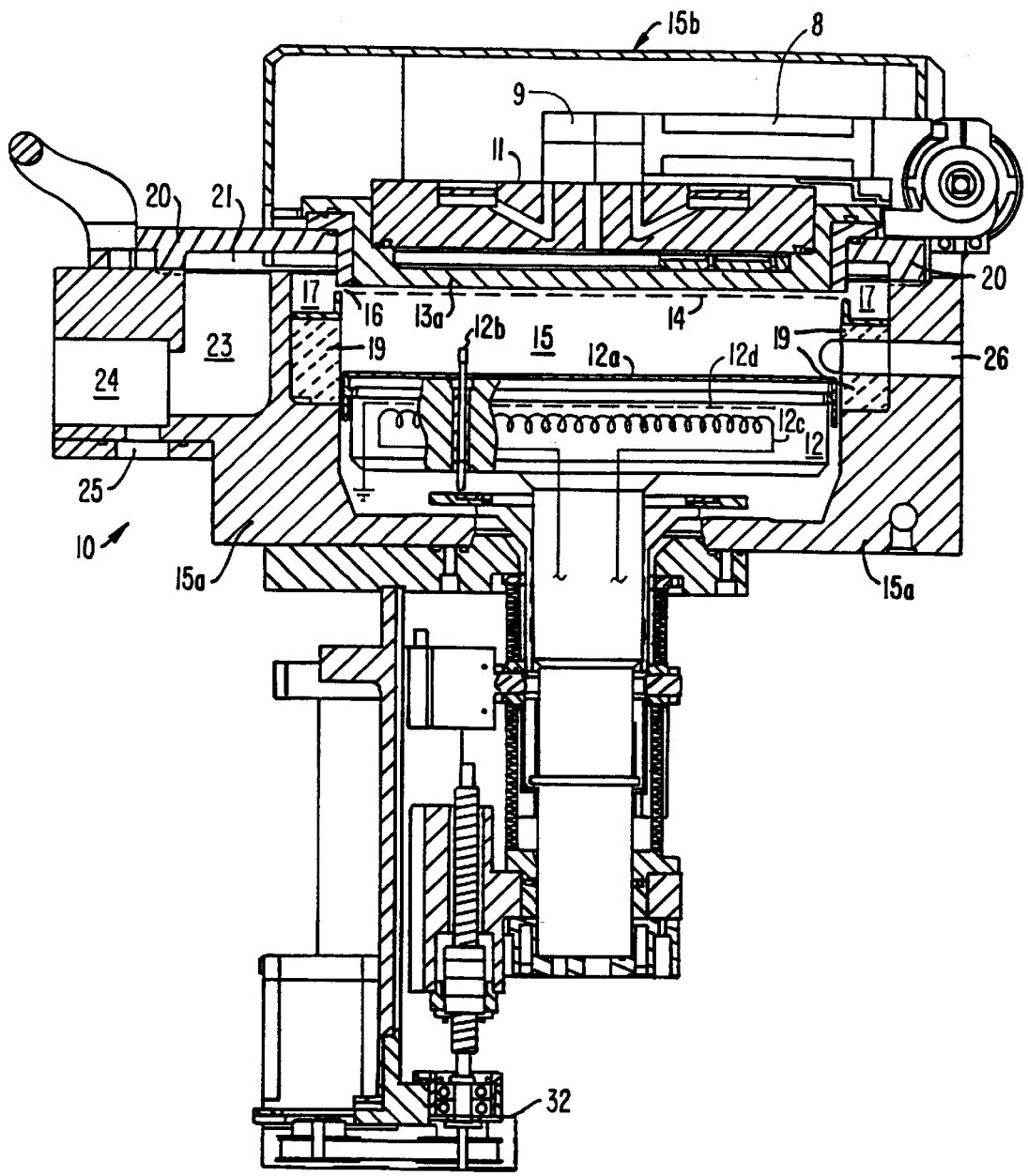
FIGS. 1A and 1B are vertical, cross-sectional views of one embodiment of an exemplary substrate processing system that may be used in accordance with the present invention.
Figure 1B:
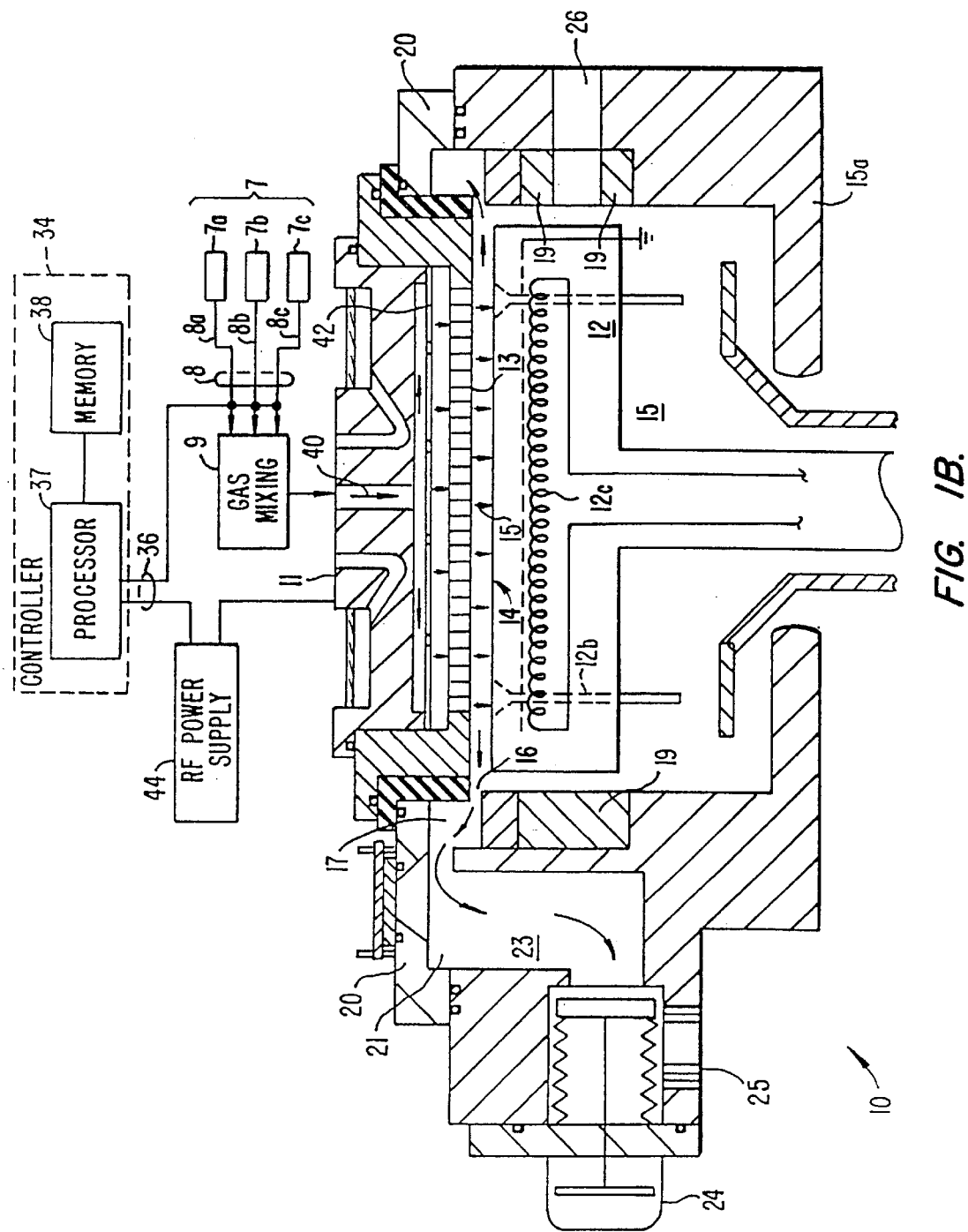

Specific embodiments of the present invention may be practiced in a variety of chemical vapor deposition (CVD) or other types of substrate processing systems. One substrate processing system which can benefit from the present invention is shown in FIGS. 1A and 1B. FIGS. 1A and 1B are vertical, cross-sectional views of a CVD system 10, having a vacuum or processing chamber 15 that includes a chamber wall 15a and chamber lid assembly 15b.

CVD system 10 contains a gas distribution manifold 11 for dispersing process gases to a substrate (not shown) that rests on a resistively heated pedestal 12 centered within the process chamber. The volume between gas distribution manifold 11 and pedestal 12 is referred to herein as a deposition zone. A portion of this volume may also be referred to in this manner. During processing, the substrate (e.g., a semiconductor substrate) is positioned on a flat (or slightly convex) surface 12a of pedestal 12. Preferably having a surface of pedestal 12 can be moved controllably between a lower loading/off-loading position (depicted in FIG. 1A) and an upper processing position (indicated by dashed line 14 in FIG. 1A and shown in FIG. 1B), which is closely adjacent to manifold 11. Pedestal 12 may be made of a ceramic, such as aluminum nitride ($Al_3N_4$), aluminum oxide ($Al_2O_3$), silicon carbide (SiC), boron carbide ($B_4C$), or the like. A centerboard (not shown) includes sensors for providing information on the position of the substrates. Deposition and carrier gases flow into chamber 15 through perforated holes of a conventional flat, circular gas distribution face plate 13a. More specifically, deposition process gases low (indicated by arrow 40 in FIG. 1B) into the chamber through the inlet manifold 11, through a conventional perforated blocker plate 42 and then through holes 13b in gas distribution faceplate 13a.

Before reaching the manifold, deposition and carrier gases are input from gas sources 7 through gas supply lines 8 (FIG. 1B) into a gas mixing block or system 9 where they are combined and then sent to manifold 11. It is also possible, and desirable in some instances, to direct deposition and carrier gases directly from supply lines 8 to manifold 11, bypassing gas mixing system 9. In other situations, any of gas lines 8 may bypass gas mixing system 9 and introduce gases through passages (not shown) in the bottom of processing chamber 15.

Generally, the supply line for each process gas includes (i) several safety shut-off valves (not shown) that can be used to automatically or manually shut off the flow of process gas into the chamber, and (ii) mass flow controllers (MFCs) (also not shown) that measure the flow of gas through the supply line. When toxic gases are used in the process, the several safety shut-off valves are positioned on each gas supply line in conventional configurations.

The deposition process performed in CVD system 10 can be either a thermal process or a plasma-enhanced process. In a plasma-enhanced process, an RF power supply 44 applies electrical power between the gas distribution faceplate 13a and an RF ground grid 12d within pedestal 12. The application of RF energy excites the process gas mixture to form a plasma within the cylindrical region between the faceplate 13a and pedestal 12. Constituents of the plasma react to deposit a desired film on the surface of the semiconductor substrate supported on pedestal 12. RF power supply 44 can be a mixed-frequency RF power supply that typically supplies power at a high RF frequency (RF1) of 13.56 MHz and at a low RF frequency (RF2) of 350 kilohertz (kHz) to enhance the decomposition of reactive species introduced into the vacuum chamber 15. Of course, RF power supply 44 can supply either single- or mixed-frequency RF power (or other desired variations) to manifold 11 to enhance the decomposition of reactive species introduced into chamber 15. In a thermal process, RF power supply 44 is not utilized, and the process gas mixture reacts thermally to deposit the desired film on the surface of the semiconductor substrate supported on pedestal 12, which is resistively heated to provide the thermal energy needed for the reaction.

During a thermal deposition process, pedestal 12 is heated, causing heating of CVD system 10. In a hot-wall system, of the type previously mentioned, a hot liquid may be circulated through chamber wall 15a to maintain chamber wall 15a at an elevated temperature when the plasma is not turned on, or during a thermal deposition process. Fluids used to heat chamber wall 15a include the typical fluid types (i.e., water-based ethylene glycol, perfluorocarbon-based electronic fluid, or oil-based thermal transfer fluids). This heating beneficially reduces or eliminates condensation of undesirable reactant products and improves the elimination of volatile products of the process gases and contaminants that might otherwise condense on the walls of cool vacuum passages and migrate back into the processing chamber during periods of no gas flow. In a cold-wall system, chamber wall 15a is not heated. This might be done, for example, during a plasma-enhanced deposition process. In such a process, the plasma heats chamber 15, including chamber wall 15a surrounding exhaust passageway 23 and shut-off valve 24. However, because the plasma is unlikely to be in equal proximity to all chamber surfaces, variations in surface temperature may occur, as previously noted.

The remainder of the gas mixture that is not deposited in a layer, including reaction products, is evacuated from the chamber by a vacuum pump (not shown). Specifically, the gases are exhausted through an annular slot 16 surrounding the reaction region and into an annular exhaust plenum 17. Annular slot 16 and plenum 17 are defined by the gap between the top of chamber wall 15a (including upper dielectric lining 19) and the bottom of circular chamber lid 20. The 360° circular symmetry and uniformity of annular slot 16 and plenum 17 are important to achieving a uniform flow of process gases over the substrate so as to deposit a uniform film on the substrate. The gases flow underneath a lateral extension portion 21 of exhaust plenum 17, past a viewing port (not shown), through a downward-extending gas passage 23, past a vacuum shut-off valve 24 (whose body is integrated with a lower portion of chamber wall 15a), and into an exhaust outlet 25 that connects to the external vacuum pump through a foreline (not shown).

The substrate support platter of resistively heated pedestal 12 is heated using an embedded, single-loop heater element. This is shown in FIG. 1A as heater element 12c. The wiring to the heater element passes through the stem of pedestal 12. A thermocouple (not shown) may also be embedded into pedestal 12, with the signal lines extending through the stem of pedestal 12. Typically, any or all of the chamber lining, gas inlet manifold faceplate, and various other processing chamber hardware are made out of material such as aluminum, anodized aluminum, or a ceramic material. An example of such CVD apparatus is described in commonly assigned U.S. Pat. No. 5,558,717 entitled "CVD Processing Chamber," issued to Zhao et al., hereby incorporated by reference in its entirety.

A lift mechanism and motor 32 (FIG. 1A) raises and lowers pedestal 12 and its substrate lift pins 12b as substrates are transferred by a robot blade (not shown) into and out of the body of the chamber through an insertion/removal opening 26 in the side of chamber 10. Motor 32 raises and lowers pedestal 12 between a processing position 14 and a lower substrate-loading position. Motor 32, various valves and MFCs of the gas delivery system, and other components of CVD system 10 are controlled by a system controller 34 (FIG. 1B) over control lines 36, of which only some are shown. Controller 34 relies on feedback from optical sensors to determine the position of movable mechanical assemblies, such as the throttle valve and pedestal that are moved by appropriate motors controlled by controller 34.

System controller 34 controls all of the activities of CVD system 10. System controller 34 executes system control software, which is a computer program stored in a computer-readable medium such as a memory 38 and executed by a processor 37. Preferably, memory 38 is a hard disk drive, but memory 38 may also be other kinds of memory. The computer program includes sets of instructions that dictate the timing, mixture of gases, chamber pressure, chamber temperature, RF power levels, pedestal position, and other parameters of a particular process. Other computer programs stored on other memory devices including, for example, the floppy disk or other appropriate drive, may also be used to operate system controller 34.

Figure 1C:
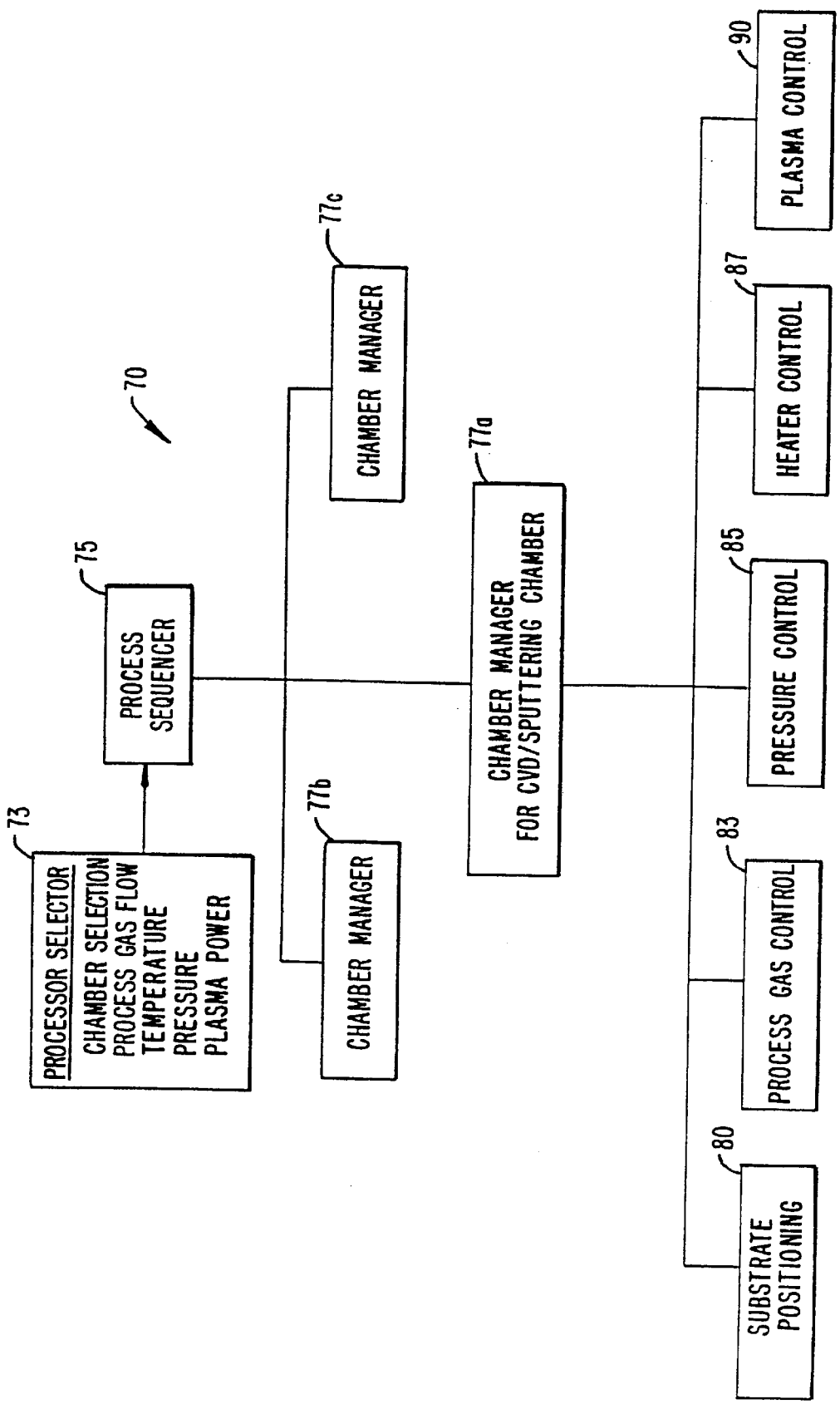
FIG. 1C shows an illustrative block diagram of the hierarchical control structure of the system control software according to a specific embodiment.

The process for depositing the film (process sets) can be implemented using a computer program product that is executed by system controller 34. FIG. 1C is an illustrative block diagram of the hierarchical control structure of the system control software, a computer program 70, according to a specific embodiment. The process sets are predetermined sets of process parameters necessary to carry out specified processes, and are identified by predefined set numbers. Process selector subroutine 73 identifies (i) the desired process chamber and (ii) the desired set of process parameters needed to operate the process chamber for performing the desired process. The signals for monitoring the process are provided by the analog and digital input boards of the system controller, and the signals for controlling the process are output on the analog and digital output boards of CVD system 10.

A process sequencer subroutine 75 comprises program code for accepting the set of process parameters from process selector subroutine 73 and for controlling operation of the various process chambers. Once it determines which process chamber and process set combination is to be executed, process sequencer subroutine 75 initiates execution of the process set by passing the particular process set parameters to chamber manager subroutines 77a–c, which control multiple processing tasks in process chamber 15 according to the process set determined by process sequencer subroutine 75. Examples of chamber component subroutines are a substrate positioning subroutine 80, a process gas control subroutine 83, a pressure control subroutine 85, a heater control subroutine 87, and a plasma control subroutine 90. Those having ordinary skill in the art will readily recognize that other chamber control subroutines can be included depending on what processes are to be performed in process chamber 15.

The operation of various aspects of the substrate processing system are controlled by one or more of the aforementioned subroutines. For example, heater control subroutine 87 comprises program code for controlling the current to a heating unit that is used to heat the substrate. Heater control subroutine 87 is also invoked by chamber manager subroutine 77a and receives a target, or set-point, temperature parameter. Heater control subroutine 87 measures temperature by measuring voltage output of a thermocouple (not shown) located in pedestal 12, comparing the measured temperature with the set-point temperature, and increasing or decreasing current applied to the heating unit to obtain the set-point temperature. The temperature is obtained from the measured voltage by looking up the corresponding temperature in a stored conversion table or by calculating the temperature using a fourth-order polynomial. When an embedded loop is used to heat pedestal 12, heater control subroutine 87 gradually controls a ramp up/down of current applied to the loop. Additionally, a built-in fail-safe mode can be included to detect process safety compliance, and can shut down operation of the heating unit if process chamber 15 is not configured properly. Another example is plasma control subroutine 90, which comprises code for setting the low- and high-frequency RF power levels applied to the process electrodes in processing chamber 15, and for setting the low-frequency RF frequency employed. Plasma control subroutine 90 also includes program code for turning on and setting/adjusting the power levels applied to the magnetron or other microwave source used in the present invention.

Plasma control subroutine 90 is invoked by chamber manager subroutine 77a, in a fashion similar to the previously described chamber component subroutines. Other of the subroutines control the various other aspects of the operation of CVD system 10.

The above description is mainly for illustrative purposes. Other CVD equipment such as electron cyclotron resonance (ECR) plasma CVD systems, induction-coupled RF, high-density plasma-CVD systems, or the like may be employ a ground fault interrupt prevention system of the present invention. Moreover, other substrate processing systems, such as etching systems, ion implant systems, and the like, may employ the present invention. Variations of the above-described system, such as variations in pedestal design, heater design, RF power frequencies, and location of RF power connections, as well as other alterations, are also possible. It should therefore be recognized that the present invention is not necessarily limited to use with any specific apparatus.

III. Ground Fault Interrupts in Substrate Processing Systems

As noted, the detection and appropriate handling of ground faults is important for several reasons (e.g., operator safety). However, certain substrate processing systems have been found to experience spurious tripping of their GFI circuits. The inventors discovered that the offending ground faults are caused by current leakage from the pedestal's heater element, as well as from the heater element's supply lines. The inventors also discovered that in substrate processing systems employing a plasma, some of the RF energy used to create the plasma feeds through to the heater element driver and the facility's power supply. The inventors further discovered that the leakage currents observed are caused by a drastic reduction in the volume resistance of the material from which the pedestal is made (e.g., ceramics such as aluminum nitride ($Al_3N_4$), aluminum oxide ($Al_2O_3$), silicon carbide (SiC), boron carbide ($B_4C$), or the like). This marked drop in volume resistivity occurs when the pedestal's temperature rises above about 500° C.

Figure 2:
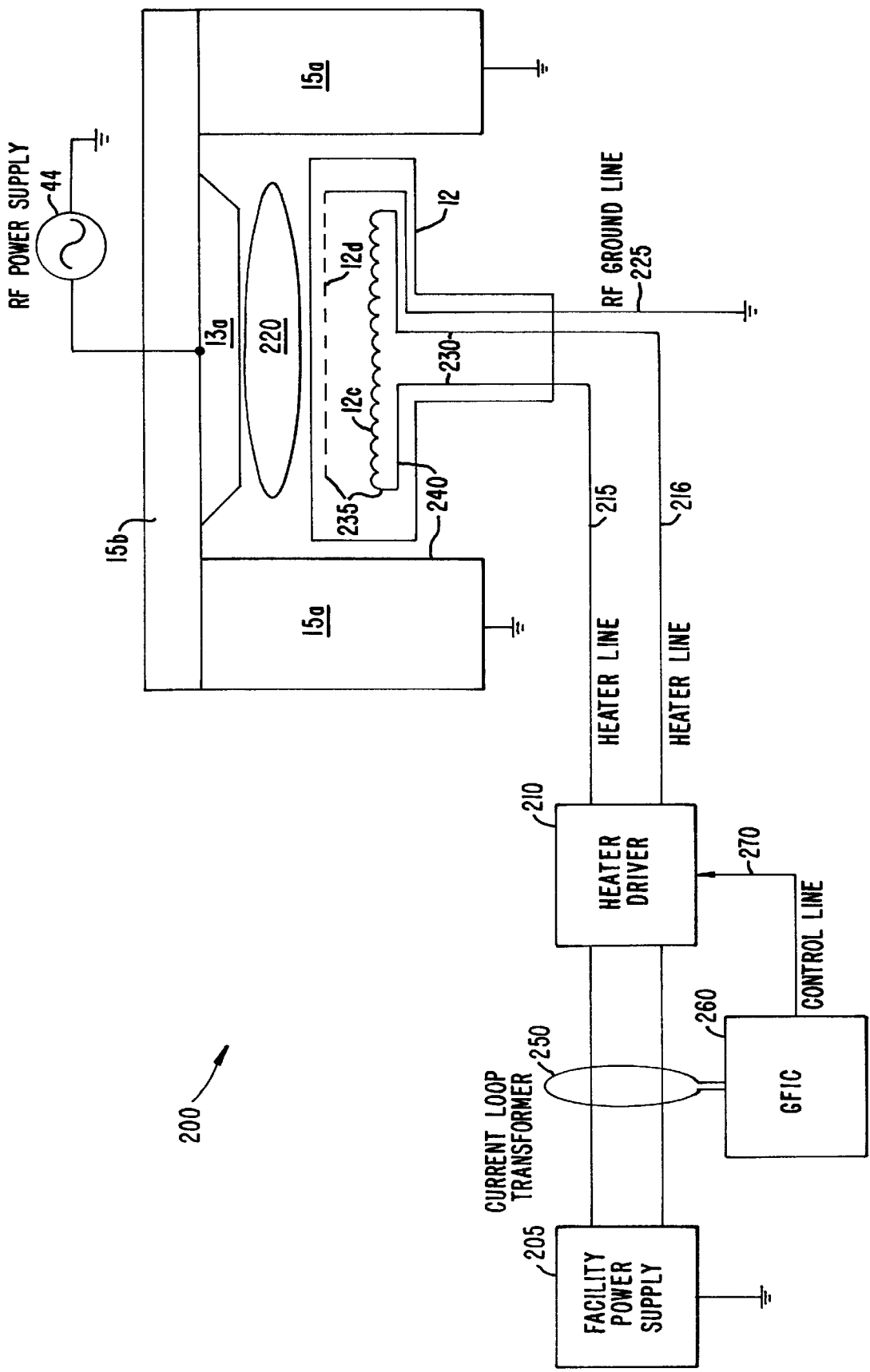
FIG. 2 is a simplified block diagram of a substrate processing system showing certain of the leakage currents that can exist in such a system.

FIG. 2 illustrates a substrate processing system 200 and the major current leakage paths that were found by the inventors to contribute significantly to the leakage current causing spurious ground faults. Substrate processing system 200 may be of any conventional design, such as that illustrated by CVD system 10. Substrate processing system 200 is powered by a facility power supply 205. Facility power supply 205 supplies AC power to heater driver 210 as part of supplying power to the subsystems of substrate processing system 200. Other subsystems of substrate processing system 200 would include the control electronics, substrate transport mechanisms, and other such subsystems. A heater driver 210 supplies AC power to heater element 12c over heater lines 215 and 216. As noted in the description of CVD system 10, RF power supply 44 provides RF energy to gas distribution face plate 13a to generate a plasma 220. Plasma 220 is generated between gas distribution face plate 13a and RF ground grid 12d. RF ground grid 12d is coupled to ground by an RF ground line 225. It should be noted, however, that the phenomena discovered by the inventors could also occur in systems that apply the RF power to the electrode within the pedestal, systems that use multiple grids (whether grounded or powered), and other systems using alternative configurations. Also grounded is chamber wall 15a. However, the present invention addresses the problems caused by spurious ground fault interruptions in any system experiencing leakage currents such as those described herein. Heater element 12c and RF ground grid 12d are disposed within pedestal 12, as shown on FIGS. 1A, 1B and 2.

A current loop transformer 250 is used to detect current leakage by detecting the difference between current into and out of heater driver 210. Current loop transformer 250 is connected to a GFI circuit (GFIC) 260. GFIC 260 permits control over the reaction to and handling of ground fault interrupts by controlling the power supplied to substrate processing system 200. This is illustrated in FIG. 2 by control lines 270 over which a ground fault interrupt signal may be sent to heater driver 210 (and other system control circuitry) to shut down the substrate processing system in the event of a ground fault.

As noted, the inventors discovered that current can leak from heater element 12c and heater lines 215 and 216, thereby causing the ground faults observed by the inventors. The inventors discovered three major leakage paths, which are illustrated in FIG. 2. The major leakage paths were identified as leakage between heater line 215 and 216 (indicated as leakage path 230), the leakage path between heater element 12c and RF ground grid 12d (indicated as leakage path 235), and leakage between heater element 12c and chamber wall 15a (indicated in FIG. 2 as leakage path 240). Other leakage paths may exist, of course. For example, when a thermocouple is embedded in pedestal 12, leakage can also occur between the heater lines and heater element, and the ground sheath of the thermocouple.

Chief among these leakage paths is leakage path 235 between heater element 12c and RF ground grid 12d. The inventors determined that these leakage paths occurred due to a drastic drop in volume resistivity of the material from which pedestal 12 is formed. This drop in volume resistivity is evidenced by the experimental data in Table 1.

TABLE 1

Experimental volume resistivity data for various materials.

| Material | $Al_3N_4$ Content | Volume Resistivity at 25° C. (in Ω/cm) | Volume Resistivity at 600° C. (in Ω/cm) |
|---|---|---|---|
| A | 99.9% | $1 \times 10^{13}$–$1 \times 10^{14}$ | $1 \times 10^5$ |
| B | 99.9% | $1 \times 10^{15}$ | $1 \times 10^7$ |
| C | 95% | $1 \times 10^{15}$ | $1 \times 10^6$–$1 \times 10^7$ |
| D | 95% | $1 \times 10^{16}$ | $1 \times 10^8$–$1 \times 10^9$ |

The measurements at shown in Table 1 were made at 500 V/mm. The inventors thus discovered that the materials commonly used to fabricate pedestal 12, such as aluminum nitride ($Al_3N_4$), aluminum oxide ($Al_2O_3$), silicon carbide (SiC), boron carbide ($B_4C$), and similar materials, can experience a precipitous drop in volume resistivity above a temperature of about 500° C., as is illustrated by the data in Table 1.

Figure 3:
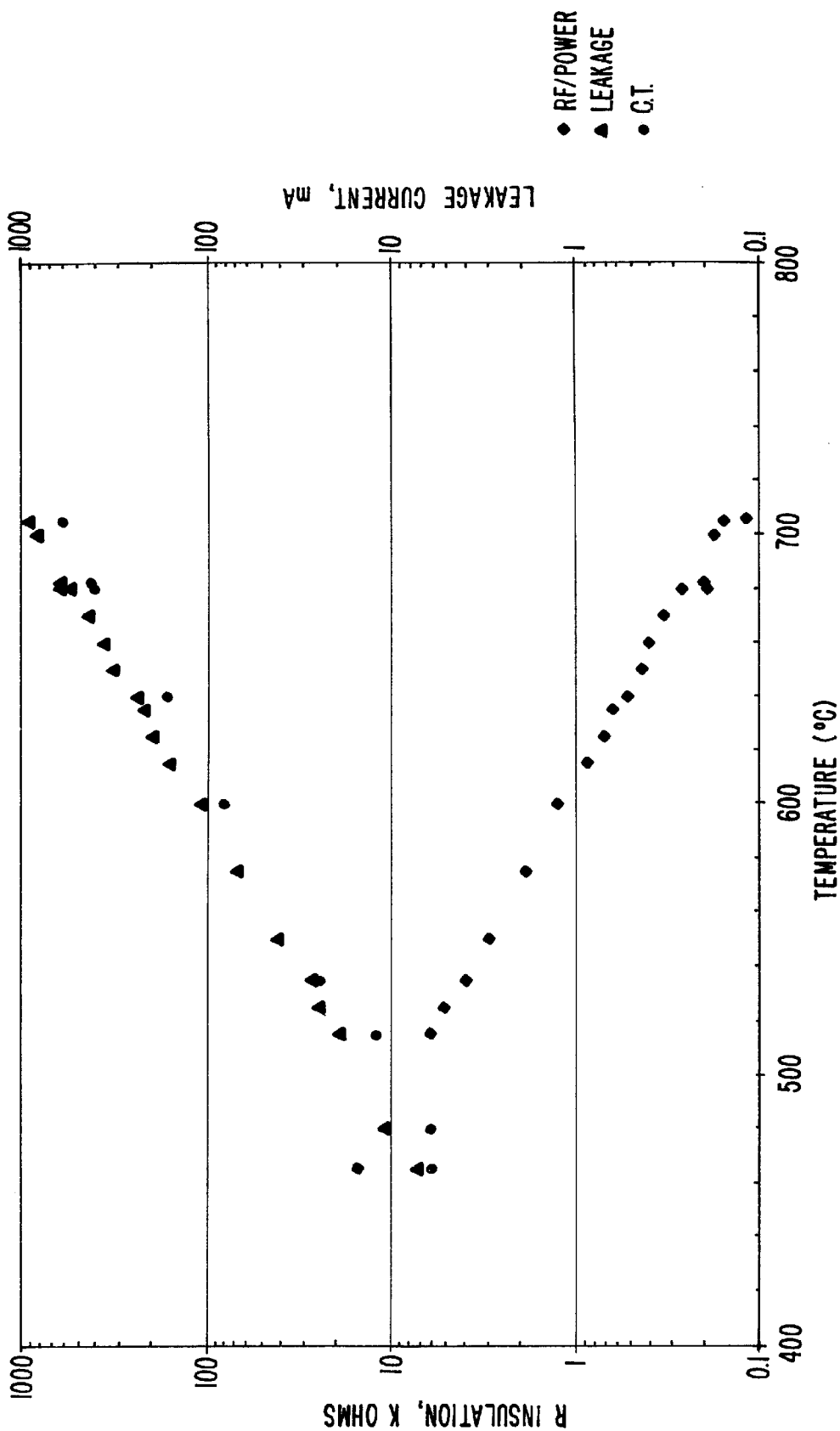
FIG. 3 is a graph of resistive insulation of the material of a substrate processing system pedestal, and leakage current therethrough, versus temperature.

This drop in volume resistivity and concomitant rise in leakage current can be seen in FIG. 3, which is a graph of insulation resistance, leakage current, and current transformer output versus temperature. As can be seen, the insulation resistance of the pedestal's ceramic material (indicated in FIG. 3 as the resistance between RF ground grid 12d and heater line 215/heater line 216/heater element 12c, or "RF/Power," and represented by diamonds in the graph) falls by about two orders of magnitude just between 500° C. and 700° C., becoming markedly reduced at about 700° C. Conversely, leakage currents (indicated in FIG. 3 simply as "leakage," and represented by triangles in the graph) rise from about 10 mA to about 1 A in that same interval, rising by about two orders of magnitude over that range, as is implied by the drop in resistive insulation values. In a similar fashion, the difference between the current into and out of heater element 12c (indicated in FIG. 3 as the current transformer output, or "CT," and represented by circles in the graph) detected by a current monitor monitoring heater lines 215 and 216 also rises by about two orders of magnitude, closely tracking leakage current. As the graph of FIG. 3 illustrates, the effect of temperature on these variables is profound.

As previously noted, this drop in volume resistivity also permits RF energy from RF power supply 44 to feed through plasma 220 and heater lines 215 and 216 to heater driver 210, and subsequently to facility power supply 205. This feeding through of RF energy causes the previously described EMI and associated interference in electronic circuitry powered by facility power supply 205.

Normally, the threshold for tripping ground fault circuitry in systems such as the exemplary substrate processing system described previously is approximately 30 mA. One solution to the problem of spurious ground faults could have been simply to raise the threshold to a higher level (e.g., 100 mA). However, such a high ground fault threshold would expose operators to an increased risk of severe electrical shock by allowing greater leakage currents from all sources, not just those addressed by the present invention, with the aforementioned adverse effects. Thus, in such systems, raising the ground fault interrupt threshold would only mean that the other leakage currents to which the operator exposed would be increased without providing any additional protection.

More importantly, raising the threshold to a higher level would only reduce the frequency of ground faults capable of tripping the system's GFI circuitry. Such a solution would not eliminate the possibility of system shutdown due to spurious ground faults. Given the deleterious effects of such shutdowns, as previously discussed, a solution eliminating the offending ground faults is necessary.

Figure 4:
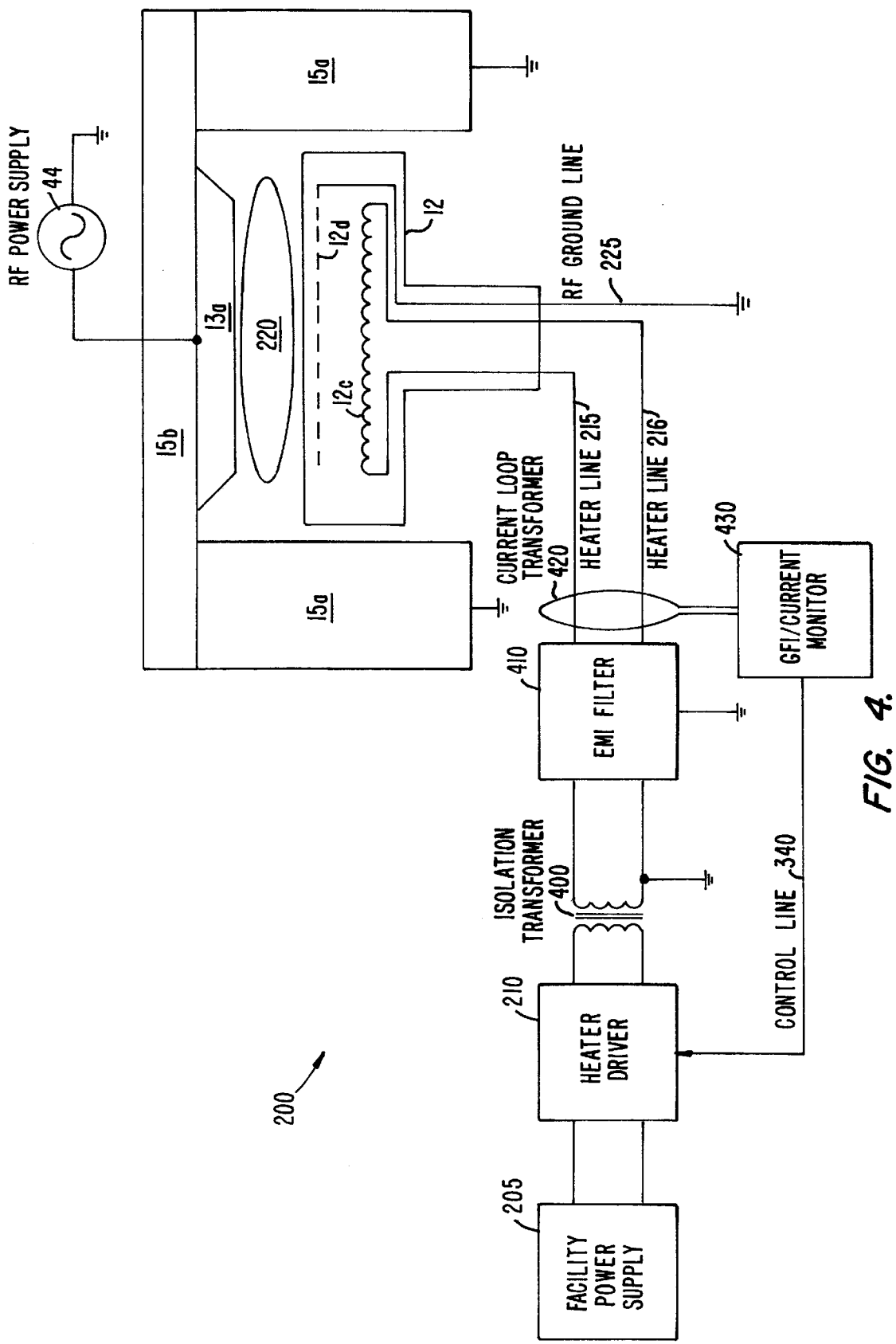
FIG. 4 is a simplified block diagram of a ground fault prevention circuit in accordance with a specific embodiment of the present invention.

IV. A Circuit for Preventing Ground Fault Interrupts According to Present Invention FIG. 4 illustrates generally a ground fault prevention circuit according to the present invention. The block diagram of FIG. 4 is described with reference to the detailed view of CVD system 10 offered in FIGS. 1A–1C. References made with respect to the elements thereof, as well as those elements introduced in other figures, are thus made using the reference numerals with which such elements were introduced. The process is therefore described in terms of a CVD processing system such as CVD system 10, although this should not be seen to limit the present invention's use to only such systems.

FIG. 4 illustrates one embodiment of the present invention conceived by the inventors to solve the problem of certain leakage currents in a substrate processing system such as substrate processing system 200 (e.g., CVD system 10). In order to remove what was essentially a ground loop between the output of heater driver 210 (i.e., the AC power supply to heater element 12c) and the ground of facility power supply 205, the inventors isolated heater element 12c using a transformer 400. Preferably, transformer 400 is an isolation transformer with a 1:1 ratio, in order to isolate heater element 12c and heater lines 215 and 216 without significantly altering the voltage or current supplied to heater element 12c. The ground loop between the ground of facility power supply 205 and heater element 12c is thus broken because no such leakage currents flow through transformer 400.

In order to prevent RF energy from feeding back from RF power supply 44 through transformer 400, an electromagnetic interference (EMI) filter 410 was coupled between the output of transformer 400 and heater lines 215 and 216. The characteristics of EMI filter 410 will vary with the configuration of substrate processing system 200, the process being performed, the amount of RF feedthrough reduction desired, and other parameters. For example, when using a 350 KHz RF source, a filter such as the Corcom model 30ESK6 could be used, providing a 35 dB insertion loss at 350 KHz, low current leakage, and isolation of the power line from equipment ground. EMI filter 410 is only necessary in substrate processing systems supporting plasma processing. While it would prevent ground loops with regard to the leakage currents, transformer 400 would have little effect on the AC power provided by RF power supply 44. In placing EMI filter 410 between transformer 400 and heater element 12c, the only remaining circuit is the intended one between RF power supply 44 and RF ground line 225.

While transformer 400 breaks any ground loops that might have existed between heater elements 12c and facility power supply 205, it is desirable to determine the remaining current leakage from heater element 12c for reasons of equipment protection. Previously, the system's ground fault interrupt controller would monitor the current into and out of heater driver 210 in order to detect ground faults in the heater circuit. In the present invention, as shown in FIG. 4, a current loop transformer 420 is used to determine the current leakage by monitoring heater lines 215 and 216 (because no leakage could be detected on the supply lines to heater driver 210, as such leakage currents can no longer flow). Current loop transformer 420 is connected to a GFI/current monitor 430 which permits the current through heater lines 215 and 216 to be monitored. GFI/current monitor 430 can use this information for display and/or ground fault interrupt control. This is illustrated in FIG. 4 by control lines 340 over which a ground fault interrupt signal may be sent to heater driver 210 (and other system control circuitry) to shut down the substrate processing system in the event of a ground fault.

It is to be understood that the above description is intended to be illustrative and not restrictive. Many alternative embodiments will be apparent to those of skill in the art upon reviewing the above description. By way of example, the system control software (more specifically, heater control subroutine 87) could be made to receive input from GFI/current monitor 430 in order to modulate the output of heater driver 210, maintaining the temperature of pedestal 12 at a level that keeps the leakage currents at acceptable levels while, of course, maintaining the temperature within the temperature limits defined by the current process being performed. Moreover, the system control software, via heater control subroutine 87 or other modules, could be used to gather process data and indicate when pedestal 12 required replacement (due to high leakage currents). The inventions herein have been illustrated primarily with regard to a conventional substrate processing system, but they are not so limited. Those skilled in the art will recognize other equivalent or alternative substrate processing systems may be employ the present invention while remaining within the scope of the claims of the present invention. The scope of the inventions should therefore be determined not with reference to the above description, but should instead be determined with reference to the appended claims, along with the full scope of equivalents to which such claims are entitled.

What is claimed is:

1. A pedestal heating system configured to heat a pedestal disposed in a processing chamber of a substrate processing system, comprising:

a heater power supply;

an isolation transformer, coupled to said heater power supply;

a heater element, disposed within the pedestal and coupled to said isolation transformer, wherein said isolation transformer is configured to reduce leakage current from said heater element to a chamber wall of said processing chamber.

2. The system of claim 1, wherein said isolation transformer is configured as a 1:1 isolation transformer.

3. A pedestal heating system configured to heat a pedestal disposed in a processing chamber of a substrate processing system, comprising:

a heater power supply;

a transformer coupled to said heater power supply;

a heater element, disposed within the pedestal and coupled to said transformer, wherein said transformer is configured to reduce leakage current from said heater element to a chamber wall of said processing chamber;

an RF energy source;

an RF electrode, coupled to said RF energy source, and disposed within the processing chamber;

an RF ground electrode, disposed within the pedestal; and a filter, coupled between said transformer and said heater element, and configured to reduce feedthrough of RF energy from said RF energy source through said transformer.

4. The system of claim 3, wherein said filter is an electromagnetic interference filter.

5. The system of claim 3, wherein said filter is coupled between said heater power supply and said transformer.

6. The system of claim 3, wherein said apparatus further comprises:

a facility power supply, coupled to said heater power supply, wherein said filter is coupled between said facility power supply and said heater power supply.

7. The system of claim 6, wherein said filter is coupled between said facility power supply and a plurality of heater power supplies, each one of said heater power supplies being disposed in one of a plurality of substrate processing systems.

8. A pedestal heating system configured to heat a pedestal disposed in a processing chamber of a substrate processing system, comprising:

a heater power supply;

a transformer coupled to said heater power supply;

a heater element, disposed within the pedestal and coupled to said transformer. wherein said transformer is configured to reduce leakage current from said heater element to a chamber wall of said processing chamber;

wherein a material of the pedestal is ceramic.

9. The system of claim 8, wherein a material of the pedestal is 95% aluminum nitride.

10. The system of claim 8, wherein a material of the pedestal is 99.9% aluminum nitride.

11. A pedestal heating system configured to heat a pedestal disposed in a processing chamber of a substrate processing system, comprising:

a heater power supply;

a transformer, coupled to said heater power supply;

a heater element, disposed within the pedestal and coupled to said transformer; and an RF ground electrode, disposed within the pedestal, wherein said transformer is configured to reduce leakage current from said heater element to said RF ground electrode.

12. The system of claim 11, wherein said transformer is further configured to localize a current leakage loop to said heater element.

13. The system of claim 11, wherein said transformer is configured as a 1:1 transformer.

14. The system of claim 11, wherein said apparatus further comprises:

an RF energy source;

an RF electrode, coupled to said RF energy source, and disposed within the processing chamber;

a filter, coupled between said transformer and said heater element, and configured to reduce feedthrough of RF energy from said RF energy source through said transformer.

15. The system of claim 14, wherein said filter is an electromagnetic interference filter.

16. The system of claim 14, wherein said filter is coupled between said heater power supply and said transformer.

17. The system of claim 14, wherein said apparatus further comprises:

a facility power supply, coupled to said heater power supply, wherein said filter is coupled between said facility power supply and said heater power supply.

18. The system of claim 17, wherein said filter is coupled between said facility power supply and a plurality of heater power supplies, each one of said heater power supplies being disposed in one of a plurality of substrate processing systems.

19. The system of claim 11, wherein a material of the pedestal is ceramic.

20. A method for preventing ground fault interrupts in a substrate processing system, the substrate processing system having a pedestal and RF electrode disposed in a processing chamber thereof, comprising the steps of:

isolating a heater element disposed in the pedestal from a heater power supply of the substrate processing system by coupling an isolation transformer between said heater element and said heater power supply; and isolating an RF power supply from said heater power supply by coupling an electromagnetic filter between said transformer and said heater element, wherein said RF power supply is coupled to said RF electrode.

* * * * *